United States Patent
Araki et al.

(10) Patent No.: US 7,091,776 B2
(45) Date of Patent: Aug. 15, 2006

(54) POWER AMPLIFIER AND RADIO COMMUNICATION DEVICE USING THE AMPLIFIER

(75) Inventors: Yuta Araki, Tokyo (JP); Hiroyuki Kayano, Fujisawa (JP); Keiichi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/258,170

(22) Filed: Oct. 26, 2005

(65) Prior Publication Data

US 2006/0038612 A1 Feb. 23, 2006

Related U.S. Application Data

(62) Division of application No. 10/807,244, filed on Mar. 24, 2004.

(30) Foreign Application Priority Data

May 26, 2003 (JP) ............................... 2003-147917

(51) Int. Cl.
*H03F 3/68* (2006.01)

(52) U.S. Cl. .................................... 330/126; 330/124 R
(58) Field of Classification Search ................ 330/126, 330/295, 302
See application file for complete search history.

(56) References Cited

U.S. PATENT DOCUMENTS

| 5,774,017 A | 6/1998 | Adar ........................... 330/126 |
| 6,118,343 A | 9/2000 | Winslow ..................... 330/295 |
| 6,366,788 B1 | 4/2002 | Fujioka et al. ........... 455/553.1 |
| 6,813,480 B1 | 11/2004 | Losser et al. ............. 455/127.1 |

*Primary Examiner*—Khanh Van Nguyen
(74) *Attorney, Agent, or Firm*—Oblon, Spivak, McClelland, Maier & Neustadt, P.C.

(57) ABSTRACT

A power amplifier includes amplifier elements to amplify input signals of different frequencies. The amplifier also includes a power supply circuit that includes a common power supply path including an end connected to a power supply input terminal connected to a DC power supply. The amplifier further includes individual power supply paths each including an end connected to the other end of the common power supply path, and the other end connected to the main electrode of a corresponding one of the amplifier elements. The individual power supply paths have different impedances.

4 Claims, 9 Drawing Sheets

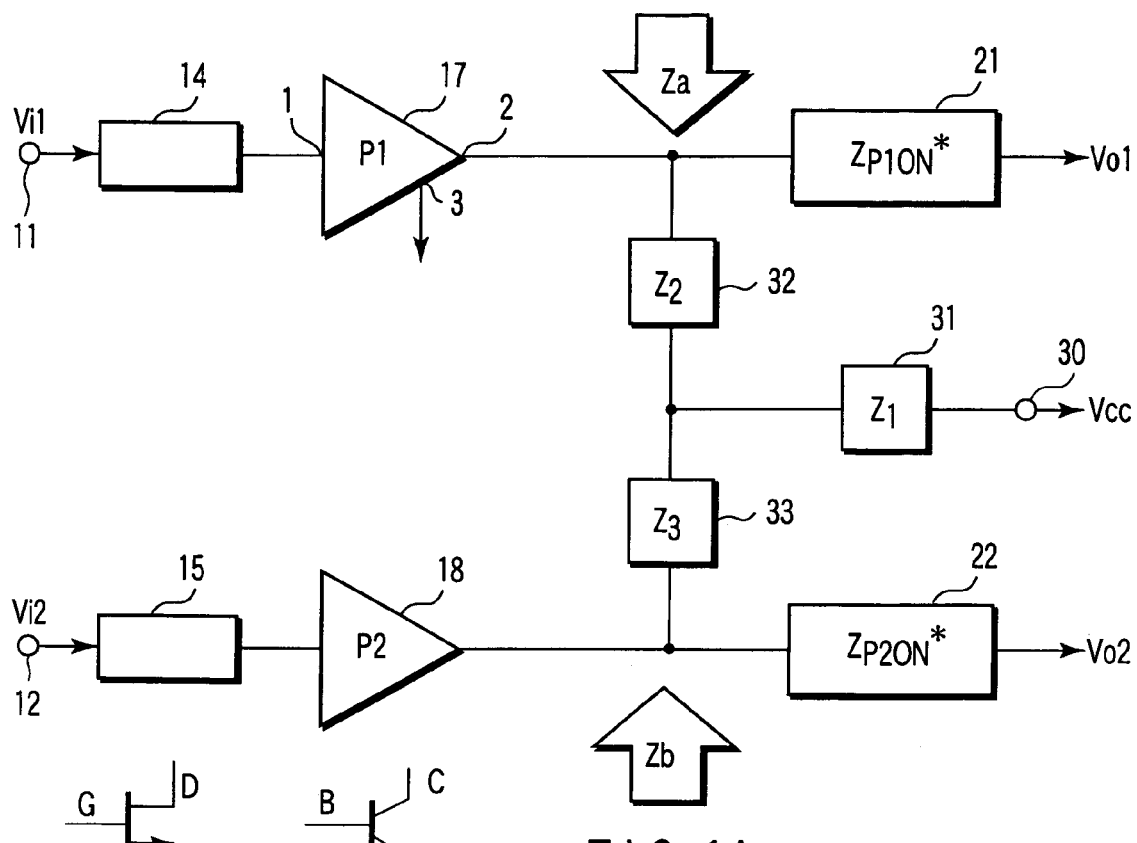
FIG. 1A
FIG. 1B  FIG. 1C
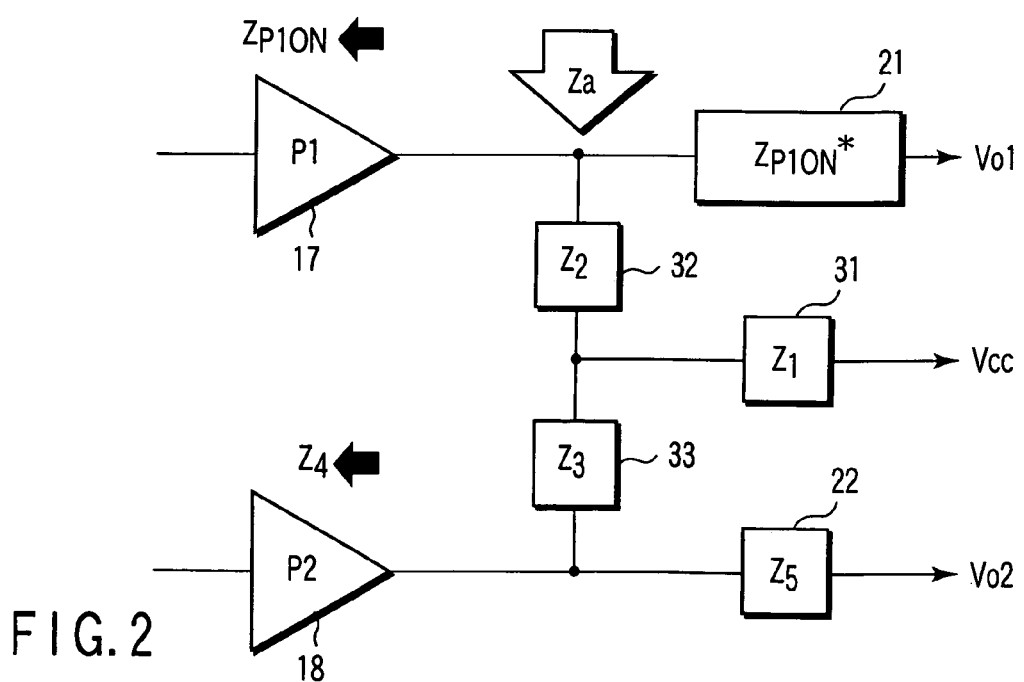
FIG. 2

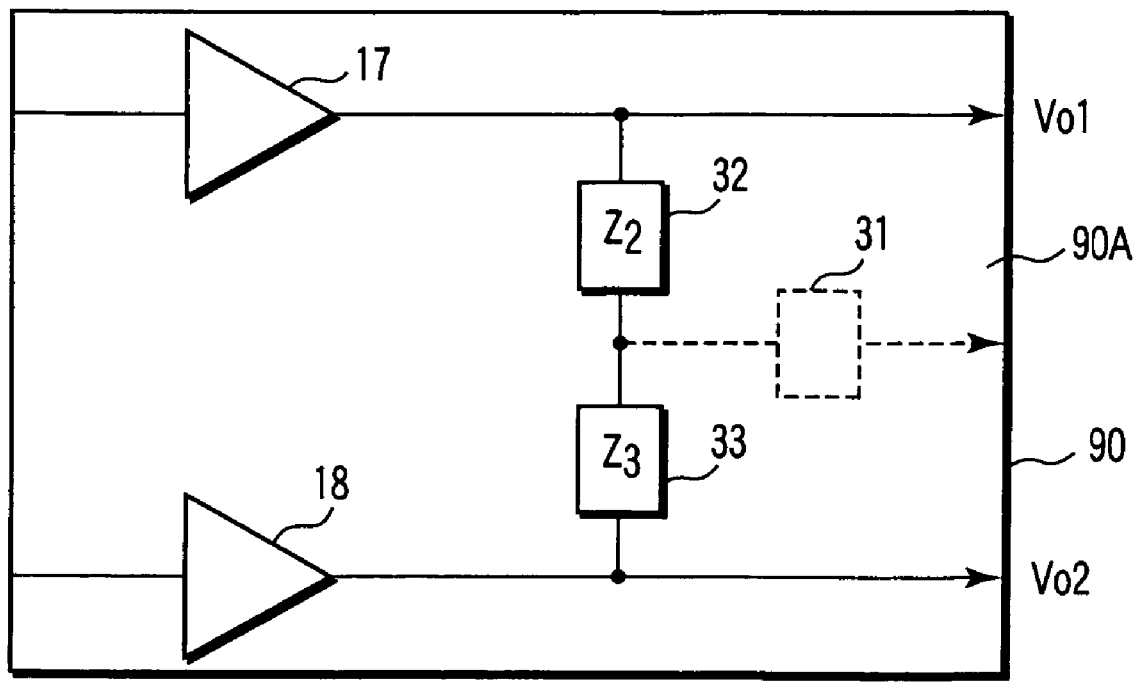
F I G. 11A
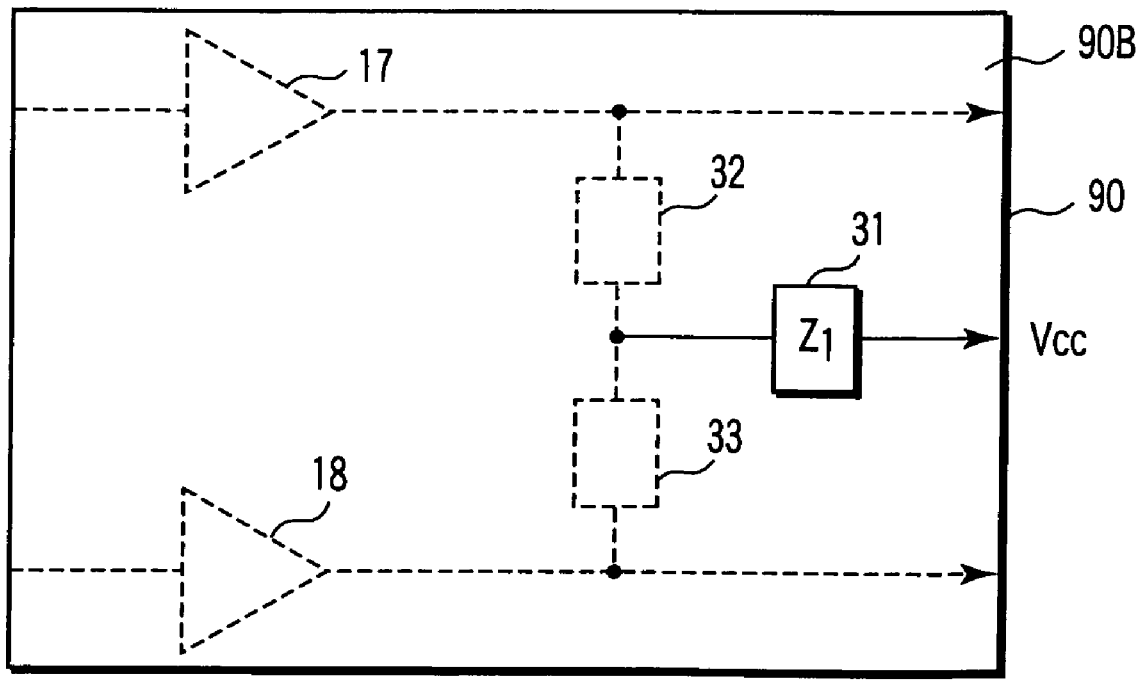
F I G. 11B

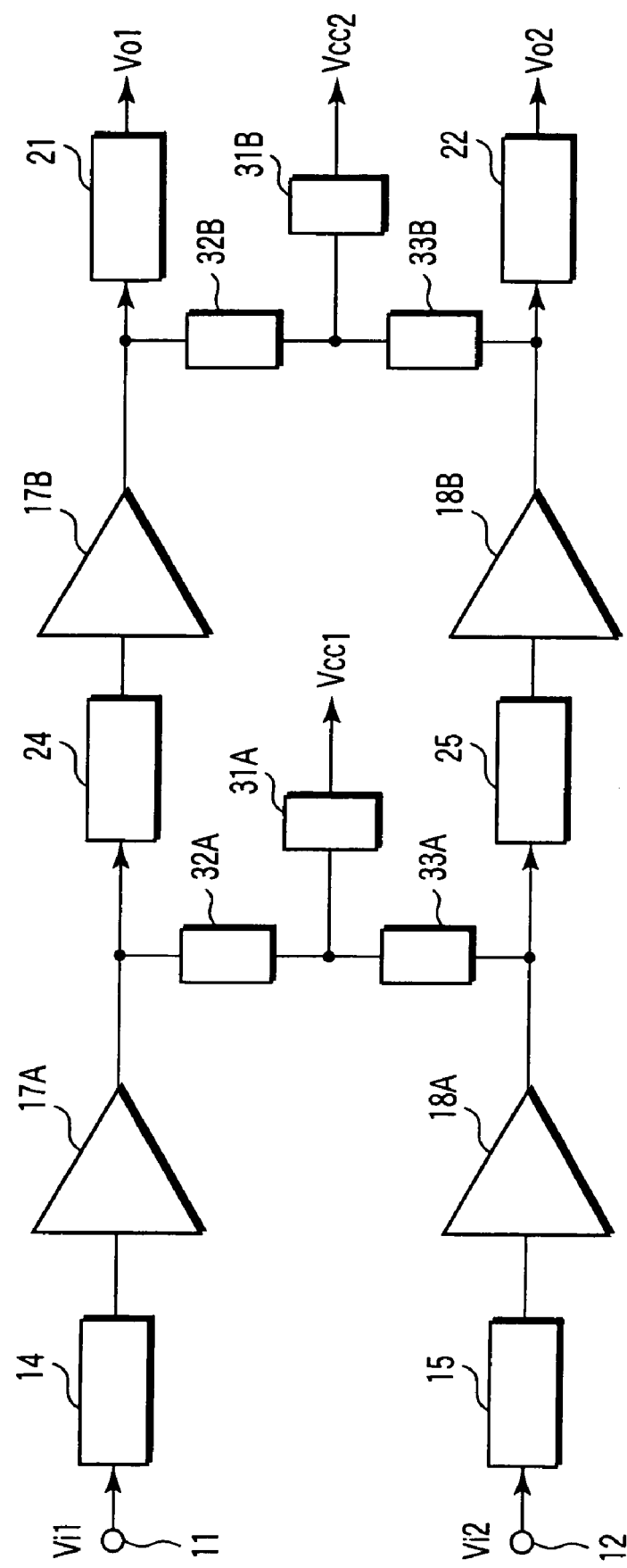
F I G. 13

POWER AMPLIFIER AND RADIO COMMUNICATION DEVICE USING THE AMPLIFIER

This application is a divisional of and claims the benefit of priority under 35 USC §120 from U.S. application Ser. No. 10/807,244, filed Mar. 24, 2004, and is based upon and claims the benefit of priority under 35 USC §119 from the prior Japanese Patent Application No. 2003-147917, filed May 26, 2003, the entire contents of which are incorporated herein by reference.

CROSS-REFERENCE TO RELATED APPLICATIONS

This application is based upon and claims the benefit of priority from prior Japanese Patent Application No. 2003-147917, filed May 26, 2003, the entire contents of which are incorporated herein by reference.

BACKGROUND OF THE INVENTION

1. Field of the Invention

The present invention relates to a power amplifier mainly for a high-frequency band, and more particularly to a power amplifier that selectively amplifies a plurality of input signals of different frequencies.

2. Description of the Related Art

There exist radio communication systems for providing services of mobile communication of a plurality of frequency bands. In such systems, radio communication devices, such as mobile terminals, are generally provided with the same number of transmission signal power amplifiers as that of frequency bands used.

For instance, in the personal digital cellular (PDC) system that uses two frequency bands, two power amplifiers for the 800-MHz band and 1900-MHz band are provided in a single mobile terminal. Even a mobile terminal compatible with different systems, such as an 800-MHz-band PDC and 1900-MHz-band personal handy-phone system (PHS), is provided with power amplifiers dedicated to respective frequency bands.

In a radio communication device, such as a mobile terminal using a plurality of frequency bands, it is difficult to satisfy-a demand for size reduction if power amplifiers dedicated to the respective frequency bands.

On the other hand, broadband amplifiers for use in measuring devices can amplify signals of different frequency bands. This type of amplifier, however, consumes much power, therefore is not suitable for mobile terminals that use a battery as a power supply. For this reason, they are not used in mobile terminals.

BRIEF SUMMARY OF THE INVENTION

It is an object of the invention to provide a power amplifier for selectively amplifying signals of different frequency bands, which can be made compact, and a radio communication device using the power amplifier.

According to an aspect of the invention, there is provided a power amplifier comprising: a first amplifier element configured to amplify a first input signal of a first frequency, the first amplifier element including a first input terminal which receives the first input signal, and a first output terminal which outputs a first output signal obtained by amplifying the first input signal; a second amplifier element configured to amplify an input signal of a second frequency, the second amplifier element including a second input terminal which receives the input signal of the second frequency, and a second output terminal which outputs a signal obtained by amplifying the input signal of the second frequency; a power supply input terminal connected to a direct-current power supply; a common power supply path including an end connected to the power supply input terminal, and another end; a first individual power supply path including an end connected to the another end of the common power supply path, and another end connected to the first output terminal, the first individual power supply path having a first impedance; and a second individual power supply path including an end connected to the another end of the common power supply path, and another end connected to the second output terminal, the second individual power supply path having a second impedance.

According to another aspect of the invention, there is provided a power amplifier similar to the above but further comprising: a first output matching circuit connected to the first output terminal of the first amplifier element; and a second output matching circuit connected to the second output terminal of the second amplifier element.

BRIEF DESCRIPTION OF THE SEVERAL VIEWS OF THE DRAWING

FIG. 1A is a block diagram of a power amplifier according to a first embodiment of the invention;

FIG. 1B shows a FET used for each amplifier element in FIG. 1A;

FIG. 1C shows a bipolar transistor used for each amplifier element in FIG. 1A;

FIG. 2 is a diagram useful in explaining the impedance relationship between components in the first embodiment, assumed when an f1 amplifier element is operating;

FIGS. 11A and 11B are schematic diagrams illustrating front-and back specific structure examples of the power amplifier of the first embodiment;

FIG. 13 is a block diagram of a multi-stage power amplifier according to a fourth embodiment.

DETAILED DESCRIPTION OF THE INVENTION

FIRST EMBODIMENT

Figure 3:
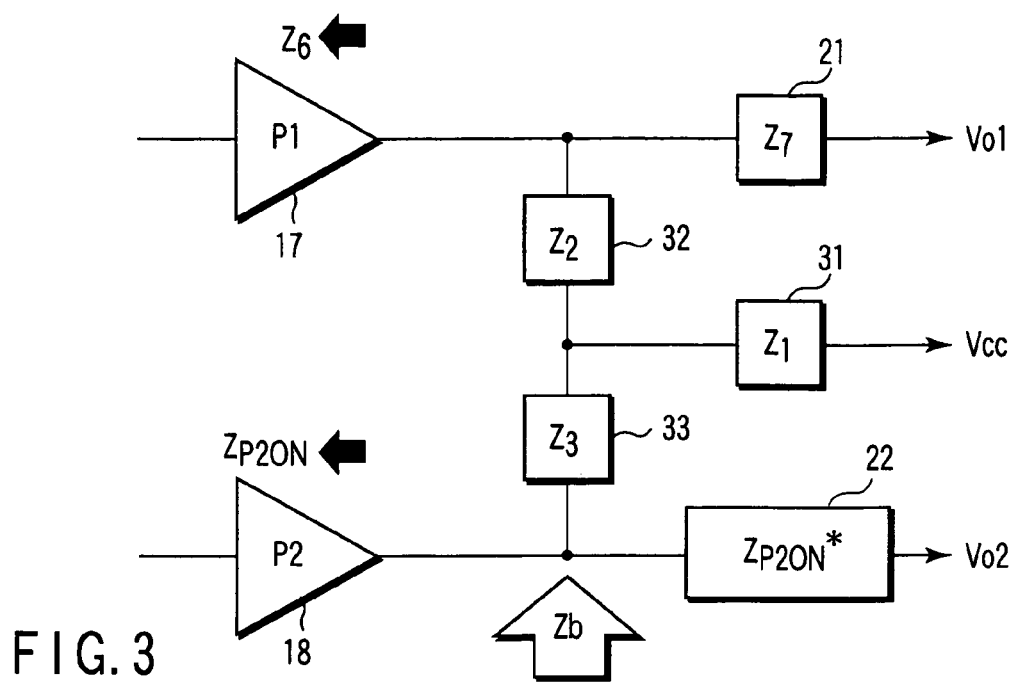
FIG. 3 is a diagram useful in explaining the impedance relationship between components in the first embodiment, assumed when an f2 amplifier element is operating.

FIG. 1A shows the configuration of a power amplifier according to a first embodiment of the invention. The first embodiment will be described using, as an example, a power amplifier operable at two frequencies f1 and f2.

The power amplifier has input terminals 11 and 12 for receiving input signals Vi1 and Vi2 of frequencies f1 and f2. The input signal Vi1 is input to the input terminal of an f1 amplifier element 17 via an input matching circuit 14. The input signal Vi2 is input to the input terminal of an f2 amplifier element 18 via an input matching circuit 15. The signal amplified by the amplifier element 17 is output as an output signal Vo1 from an output-matching circuit 21. Similarly, the signal amplified by the amplifier element 18 is output as an output signal Vo2 from an output matching circuit 22.

The amplifier elements 17 and 18 are formed of, for example, the FET as shown in FIG. 1B, or the bipolar transistor as shown in FIG. 1C. Further, each of the amplifier elements 17 and 18 is not always formed of a single transistor, but may be formed of, for example, two transistors connected in series. In FIG. 1A, reference numerals 1, 2 and 3 denote the control electrode and first and second main electrodes of the amplifier element 17. If the element 17 is formed of a FET, its gate electrode G, drain electrode D and source electrode S correspond to the control electrode and first and second main electrodes, respectively. Further, if the element 17 is formed of a bipolar transistor, its base electrode B, collector electrode C and emitter electrode E correspond the control electrode and first and second main electrodes, respectively.

The signals output from the input matching circuits 14 and 15 are input to the respective control electrodes 1 of the amplifier elements 17 and 18. The signals amplified are output from the respective first main electrodes 2 of the amplifier elements 17 and 18. The second main electrodes 3 of the amplifier elements 17 and 18 are connected to a constant potential point (not shown), for example, grounded.

The supply of power, i.e., a DC voltage, to the amplifier elements 17 and 18 is performed by a power supply circuit described below. Firstly, one end of a common power supply path 31 is connected to a power supply input terminal 30 that is connected to a DC power supply Vcc. The common power supply path 31 is connected to both the amplifier elements 17 and 18. The other end of the common power supply path 31 is connected to one end of each of individual power supply paths 32 and 33 dedicated to the amplifier elements 17 and 18, respectively. The other ends of the lines 32 and 33 are connected to the respective first main electrodes of the amplifier elements 17 and 18. As described later, the individual power supply paths 32 and 33 have different impedances.

The operation of the power amplifier of the first embodiment will be described.

The f1 and f2 amplifier elements 17 and 18 operate at different frequencies f1 and f2, as described above. However, they are controlled such that they operate exclusively. In other words, when one of the elements 17 and 18 is operating, the other is kept inoperative.

The output matching circuit 21 matches impedances with a circuit (not shown) connected after it, when the f1 amplifier element 17 is operating at the frequency f1. The circuit 21 has a conjugate impedance $Z_{P1ON}^*$ with respect to the output impedance $Z_{P1ON}$ of the amplifier element 17 during operation. Similarly, the output matching circuit 22 matches impedances with a circuit (not shown) connected after it, when the f2 amplifier element 19 is operating at the frequency f2. The circuit 22 has a conjugate impedance $Z_{P2ON}^*$ with respect to the output impedance $Z_{P2ON}$ of the amplifier element 18 during operation. The output matching circuits 21 and 22 do not necessarily have conjugate impedances with respect to the output impedances of the amplifier elements 17 and 18 during operation. They may be adapted to different purposes. For instance, the impedances of the output matching circuits 21 and 22 may be set so that the output signals Vo1 and Vo2 have the maximum levels and/or the minimum distortion values.

FIG. 2 shows the impedances of the components of FIG. 1A assumed when the input signal Vi1 of the frequency f1 is input to the input terminal 11, and the f1 amplifier element 17 is operating and the f2 amplifier element 18 is not operating. The operating amplifier element 17 has the output impedance $Z_{P1ON}$. The first main electrode (output terminal) of the amplifier element 17 is connected to the output matching circuit 21 having the conjugate impedance $Z_{P1ON}^*$ with respect to $Z_{P1ON}$, and is also connected to the power supply circuit. The power supply circuit has the common power supply path 31 and individual power supply paths 32 and 33, as described above. DC power is supplied to the f1 amplifier element 17 from the input terminal 30 via the common power supply path 31 and individual power supply path 32.

On the other hand, the f2 amplifier element 18, which is not operating, has an output impedance Z4. The impedance Z5 of the output matching circuit 22 connected to the first main electrode (output terminal) of the amplifier element 18 is identical to the conjugate impedance $Z_{P2ON}^*$ with respect to the output impedance $Z_{P2ON}$ of the amplifier element 18 during operation.

Assuming that the synthesis impedance when the power supply circuit is viewed from the first main electrode of the operating f1 amplifier element 17 is Za, Za is given by $$Z_a = \frac{Z_1\left(Z_3 + \frac{Z_4 Z_5}{Z_4 + Z_5}\right) + Z_2}{Z_2\left(Z_1 + Z_3 + \frac{Z_4 Z_5}{Z_4 + Z_5}\right)} \quad (1)$$

where Z1 represents the impedance of the common power supply path 31, Z2 and Z3 represent the impedances of the individual power supply paths 32 and 33, and Z2≠Z3. The impedances Z1, Z2 and Z3 are expressed as a frequency function, Zn(f)=Rn(f)+Xn(f) (n=1, 2, 3). Rn(f) represents the resistance component, and Xn(f) the reactance component. In equation (1) directed to the case where the input signal Vi1 of the frequency f1 is input to the input terminal 11, and the f1 amplifier element 17 is operating, Z1, Z2 and Z3 are Z1(f1), Z2(f1) and Z3(f1), respectively.

At this time, if the real part Re{Za} of the synthesis impedance Za is set higher than the real part Re{$Z_{P1ON}^*$} of the impedance $Z_{P1ON}^*$ of the output matching circuit 21, as shown in the following formula (2), the output signal (high frequency power) of the amplifier element 17 is efficiently guided to the output side via the output matching circuit 21, and output as the output signal Vo1.

$$Re\{Z_a\} > Re\{Z_{P1ON}^*\} \quad (2)$$

The greater the difference between Re{Za} and Re{$Z_{P1ON}$*}, the higher the effect. If Re{Za} is five times or more Re{$Z_{P1ON}$*}, and more preferably if the former is ten times or more the latter, the greater part of the high-frequency power of the output signal of the f1 amplifier element 17 can be output as the output signal Vo1.

FIG. 3 shows the impedances of the components of FIG. 1A assumed when the input signal Vi2 of the frequency f2 is input to the input terminal 12, and the f2 amplifier element 18 is operating and the f1 amplifier element 17 is not operating. The operating amplifier element 18 has the output impedance $Z_{P2ON}$. The first main electrode (output terminal) of the amplifier element 18 is connected to the output matching circuit 22 having the conjugate impedance $Z_{P2ON}$* with respect to $Z_{P2ON}$, and is also connected to the power supply circuit. In the power supply circuit, DC power is supplied to the f2 amplifier element 18 from the input terminal 30 via the common power supply path 31 and individual power supply path 33.

On the other hand, the f1 amplifier element 17, which is not operating, has an output impedance Z6. The impedance Z7 of the output matching circuit 21 connected to the first main electrode (output terminal) of the amplifier element 17 is identical to the conjugate impedance $Z_{P1ON}$* with respect to the output impedance $Z_{P1ON}$ of the amplifier element 17 during operation.

Assuming that the synthesis impedance when the power supply circuit is viewed from the first main electrode of the operating f2 amplifier element 18 is Zb, Zb is given by $$Z_b = \frac{Z_1\left(Z_2 + \frac{Z_6 Z_7}{Z_6 + Z_7}\right) + Z_3}{Z_3\left(Z_1 + Z_2 + \frac{Z_6 Z_7}{Z_6 + Z_7}\right)} \quad (3)$$

In equation (3) directed to the case where the input signal Vi2 of the frequency f2 is input to the input terminal 12, and the f2 amplifier element 18 is operating, Z1, Z2 and Z3 in the equation (3) are Z1(f2), Z2(f2) and Z3(f2), respectively.

At this time, if the real part Re{Zb} of the synthesis impedance Zb is set higher than the real part Re{$Z_{P2ON}$*} of the impedance $Z_{P2ON}$* of the output matching circuit 22, as shown in the following formula (4), the output signal (high frequency power) of the amplifier element 18 is efficiently guided to the output side via the output matching circuit 22, and output as the output signal Vo2.

$$\text{Re}\{Z_b\} > \text{Re}\{Z_{P2ON}*\} \quad (4)$$

Also in this case, if Re{Zb} is five times or more Re{$Z_{P2ON}$*}, and more preferably if the former is ten times or more the latter, the greater part of the high-frequency power of the output signal of the f2 amplifier element 18 can be output as the output signal Vo2.

From the above formulas (1) to (4), Z1, Z2 and Z3 are determined.

As described above, the power supply circuit for supplying power to the amplifier elements 17 and 18 comprises the common power supply path 31 commonly provided for the amplifier elements 17 and 18, and the individual power supply paths 32 and 33 provided for the amplifier elements 17 and 18, respectively, and having different impedances. By virtue of this structure, the power amplifier can be made compact.

The advantage of the above structure will now be described. Assume that the area of the common power supply path 31 is S1, and those of the individual power supply paths 32 and 33 are S2 and S3, respectively. In a power amplifier having a single amplifier element operable at a single frequency, the power supply circuit needs an area of (S1+S2) or (S1+S3) (i.e., the sum of the area S1 of the common power supply path and one of the areas S2 and S3 of the individual power supply paths). Accordingly, where two individual power supply circuits are provided for two amplifier elements, an area of (2S1+S2+S3) is needed.

On the other hand, the area of the power supply circuit employed in the embodiment is (S1+S2+S3), which is smaller by S1 than the case where individual power supply circuits are provided for two amplifier elements. Since, in general, the power supply circuit occupies a relatively large area in the power amplifier, reduction of the area of the power supply circuit significantly contributes to the reduction of the size of the power amplifier.

In the embodiment, the output matching circuits 21 and 22 are set to have conjugate impedances with respect to the output impedances of the amplifier elements 17 and 18 during operation, respectively. However, the impedances of the circuits 21 and 22 are not limited to the conjugate ones, but may be varied in accordance with purposes.

SECOND EMBODIMENT

Figure 4:
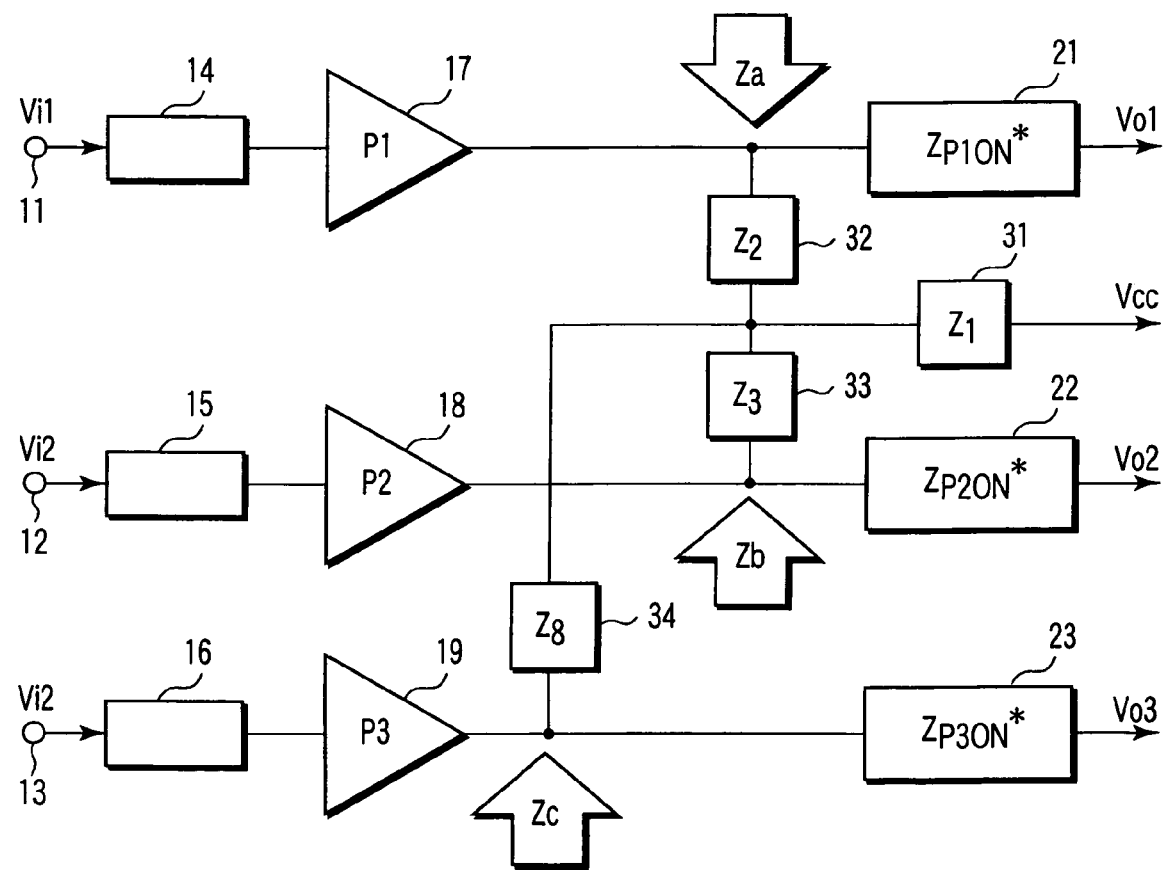
FIG. 4 illustrate the configuration of a power amplifier according to a second embodiment of the invention.
Figure 5:
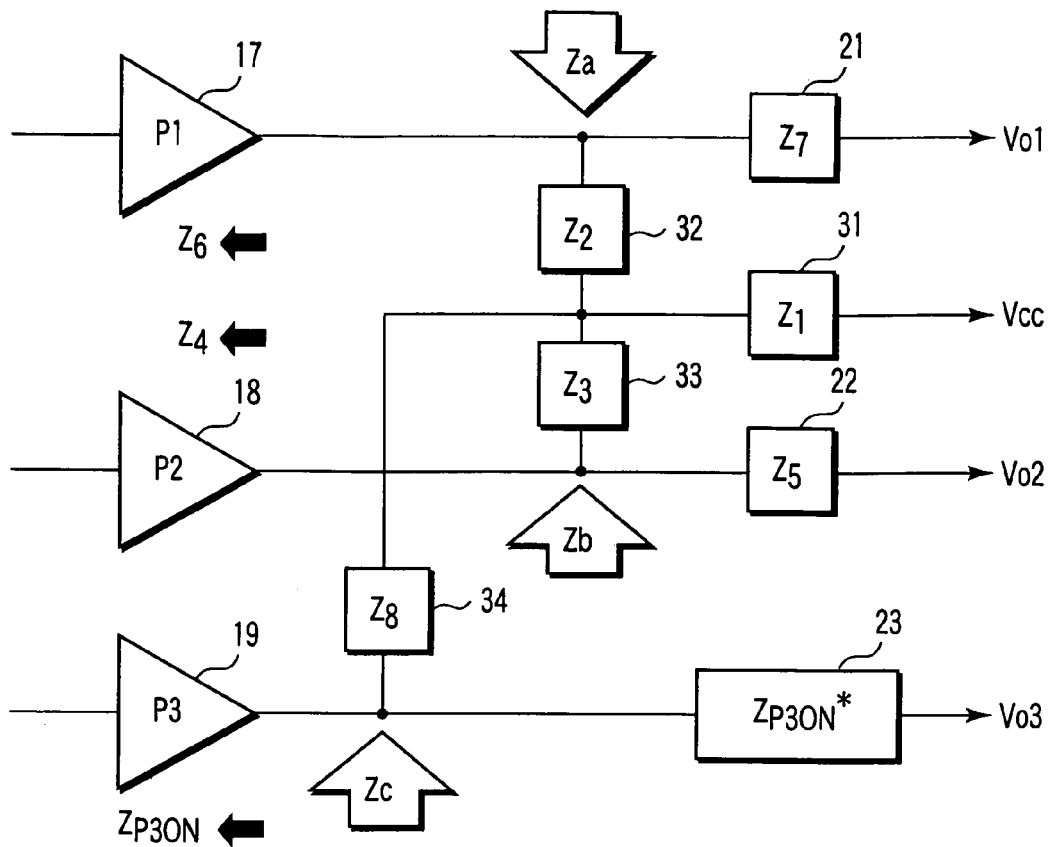
FIG. 5 is a diagram useful in explaining the impedance relationship between components in the second embodiment, assumed when an f3 amplifier element is operating.

The power amplifier of the first embodiment is operable at two frequencies f1 and f2. However, a power amplifier that is operable at three or more frequencies can be realized. In this case, it is sufficient if the power amplifier comprises three or more amplifier elements, a single common power supply path, three or more individual power supply paths and three or more output matching circuits. FIG. 4 shows a power amplifier according to a second embodiment, which is operable at three frequencies f1, f2 and f3. In FIGS. 4 and 5, elements similar to those in FIG. 1A are denoted by corresponding reference numerals.

The second embodiment employs a f3 amplifier element 19, as well as the f1 and f2 amplifier elements 17 and 18. DC power input to the power supply input terminal is supplied to one end of the common power supply path 31. After that, the DC power is distributed to the f1 amplifier element 17 via the individual power supply path 32, to the f2 amplifier element 18 via the individual power supply path 33, and to the f3 amplifier element 19 via the individual power supply path 34. The individual power supply paths 32, 33 and 34 have different impedances, as will be described later.

FIG. 5 shows the impedances of the components of FIG. 4 assumed when an input signal Vi3 of a frequency f3 is input to an input terminal 13, and the f1 and f2 amplifier elements 17 and 18 are not operating and the f3 amplifier element 19 is operating. The operating amplifier element 19 has an output impedance $Z_{P3ON}$. The first main electrode (output terminal) of the amplifier element 19 is connected to an output matching circuit 23 having a conjugate impedance $Z_{P3ON}$* with respect to $Z_{P3ON}$, and is also connected to the power supply circuit.

On the other hand, the f1 amplifier element 17, which is not operating, has an output impedance Z6. The impedance Z7 of the output matching circuit 21 connected to the first main electrode (output terminal) of the amplifier element 17 is identical to the conjugate impedance $Z_{P1ON}$* with respect to the output impedance $Z_{P1ON}$ of the amplifier element 17 during operation. Similarly, the f2 amplifier element 18, which is not operating, has an output impedance Z4. The impedance Z5 of the output matching circuit 22 connected to the first main electrode (output terminal) of the amplifier element 18 is identical to the conjugate impedance $Z_{P2ON}{}^*$ with respect to the output impedance $Z_{P2ON}$ of the amplifier element 18 during operation.

Assuming that the synthesis impedance when the power supply circuit is viewed from the first main electrode of the operating f3 amplifier element 19 is Zc, Zc is given by $$Z_c = Z_8 + \frac{Z_1\left(Z_3 + \frac{Z_4 Z_5}{Z_4 + Z_5}\right)\left(Z_2 + \frac{Z_6 Z_7}{Z_6 + Z_7}\right)}{\left(Z_3 + \frac{Z_4 Z_5}{Z_4 + Z_5}\right)\left(Z_2 + \frac{Z_6 Z_7}{Z_6 + Z_7}\right) + Z_1\left(Z_3 + \frac{Z_4 Z_5}{Z_4 + Z_5}\right) + Z_1\left(Z_2 + \frac{Z_6 Z_7}{Z_6 + Z_7}\right)} \quad (5)$$

In equation (5) directed to the case where the input signal Vi3 of the frequency f3 is input to the input terminal 13, and the f3 amplifier element 19 is operating, Z1, Z2 and Z3 are Z1(f3), Z2(f3) and Z3(f3), respectively.

Similarly, the synthesis impedance Za, obtained if the power supply circuit is viewed from the first main electrode of the f1 amplifier element 17 when the element 17 is operating and the elements 18 and 19 are not operating, is given by the following equation (6). The synthesis impedance Zb, obtained if the power supply circuit is viewed from the first main electrode of the f2 amplifier element 18 when the element 18 is operating and the elements 17 and 19 are not operating, is given by the following equation (7).

$$Z_a = Z_2 + \frac{Z_1\left(Z_3 + \frac{Z_4 Z_5}{Z_4 + Z_5}\right)\left(Z_8 + \frac{Z_9 Z_{10}}{Z_9 + Z_{10}}\right)}{\left(Z_3 + \frac{Z_4 Z_5}{Z_4 + Z_5}\right)\left(Z_8 + \frac{Z_9 Z_{10}}{Z_9 + Z_{10}}\right) + Z_1\left(Z_3 + \frac{Z_4 Z_5}{Z_4 + Z_5}\right) + Z_1\left(Z_8 + \frac{Z_9 Z_{10}}{Z_9 + Z_{10}}\right)} \quad (6)$$

$$Z_b = Z_3 + \frac{Z_1\left(Z_2 + \frac{Z_6 Z_7}{Z_6 + Z_7}\right)\left(Z_8 + \frac{Z_9 Z_{10}}{Z_9 + Z_{10}}\right)}{\left(Z_2 + \frac{Z_6 Z_7}{Z_6 + Z_7}\right)\left(Z_8 + \frac{Z_9 Z_{10}}{Z_9 + Z_{10}}\right) + Z_1\left(Z_2 + \frac{Z_6 Z_7}{Z_6 + Z_7}\right) + Z_1\left(Z_8 + \frac{Z_9 Z_{10}}{Z_9 + Z_{10}}\right)} \quad (7)$$

In equation (6) directed to the case where the input signal Vi1 of the frequency f1 is input to the input terminal 11, and the f1 amplifier element 17 is operating, Z1, Z2 and Z3 are Z1(f1), Z2(f1) and Z3(f1), respectively. Similarly, in equation (7) directed to the case where the input signal Vi2 of the frequency f2 is input to the input terminal 12, and the f2 amplifier element 18 is operating, Z1, Z2 and Z3 are Z1(f2), Z2(f2) and Z3(f2), respectively.

In those cases, if the real parts Re{Za}, Re{Zb} and Re{Zc} of the synthesis impedances Za, Zb and Zc are set higher than the real parts Re{$Z_{P1ON}{}^*$}, Re{$Z_{P2ON}{}^*$} and Re{$Z_{P3ON}{}^*$} of the impedances $Z_{P1ON}{}^*$, $Z_{P2ON}{}^*$ and $Z_{P3ON}{}^*$ of the output matching circuits 21, 22 and 23, respectively, as shown in the following formulas (8), (9) and (10), the output signals (high frequency power) of the amplifier elements 17, 18 and 19 are efficiently guided to the output side via the output matching circuits 21, 22 and 23, and output as the output signals Vo1, Vo2 and Vo3, respectively.

$$\text{Re}\{Z_a\} > \text{Re}\{Z_{P1ON}{}^*\} \quad (8)$$

$$\text{Re}\{Z_b\} > \text{Re}\{Z_{P2ON}{}^*\} \quad (9)$$

$$\text{Re}\{Z_c\} > \text{Re}\{Z_{P3ON}{}^*\} \quad (10)$$

From the formulas (1) to (10), Z1, Z2 and Z3 are determined. Even in the case of a power amplifier including four or more amplifier elements, the impedances of the common power supply path and individual power supply paths can be determined by executing the same procedure as the above.

Moreover, as in the first embodiment, if the real parts Re{Za}, Re(Zb) and Re(Zc) of the synthesis impedances Za, Zb and Zc are five times or more Re{$Z_{P1ON}{}^*$}, Re{$Z_{P3ON}{}^*$} and Re{$Z_{P2ON}{}^*$}), respectively, and more preferably if the formers are ten times or more the latters, the greater part of the high-frequency power of the output signals of the f1, f2 and f3 amplifier elements 17, 18 and 19 can be output as the output signals Vo1, Vo2 and Vo3.

A description will be given of more specific power amplifier examples according to the first and second embodiments.

Figure 6:
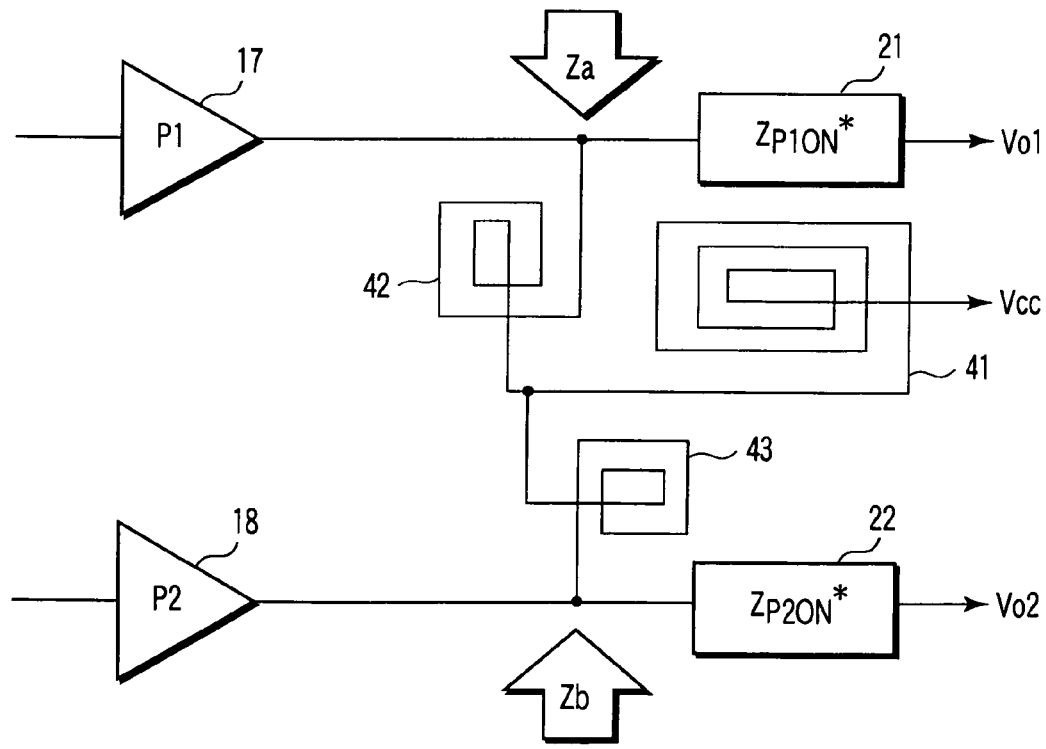
FIG. 6 shows a first structure example of a power supply circuit incorporated in the first embodiment.

FIG. 6 shows a first example of the power amplifier of the first embodiment that is operable at the frequencies f1 and f2. In this example, the power supply circuit is formed of a plurality of spiral inductors. A spiral inductor 41 corresponds to the common power supply path 31, and spiral inductors 42 and 43 correspond to the individual power supply paths 32 and 33, respectively. The impedances of the spiral inductors 41, 42 and 43 are given by $$Z_1 = R_1 + j\omega X_1 \quad (11)$$

$$Z_2 = R_2 + j\omega X_2 \quad (12)$$

$$Z_3 = R_3 + j\omega X_3 \quad (13)$$

where R1, R2 and R3 represent the resistance components, and X1, X2 and X3 the reactance components. R1, R2, R3, X1, X2 and X3 can be determined by combining the equations (11), (12) and (13) with the formulas (1), (2), (3) and (4), and setting an appropriate frequency.

Figure 7:
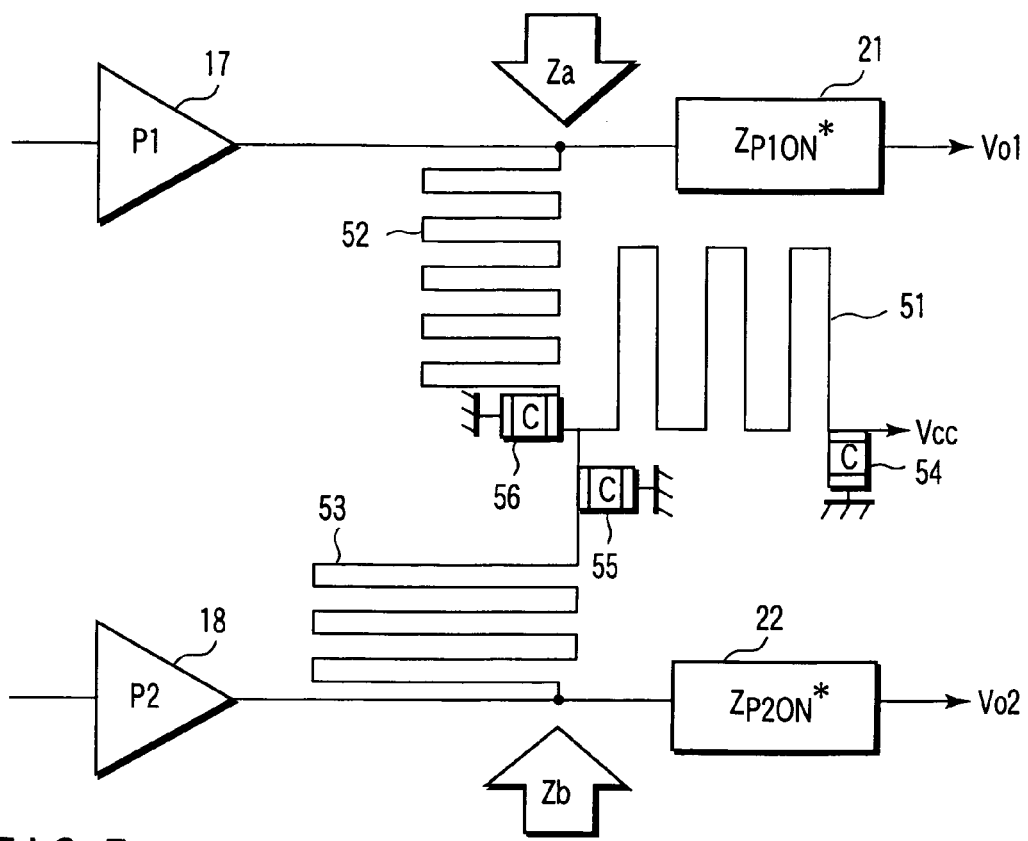
FIG. 7 shows a second structure example of the power supply circuit incorporated in the first embodiment.

FIG. 7 shows a second example of the power amplifier of the first embodiment. In this example, the power supply circuit is formed of meander lines and capacitors. A meander line 51 corresponds to the common power supply path 31, and meander lines 52 and 53 correspond to the individual power supply paths 32 and 33, respectively. Capacitors 54, 55 and 56 are provided between the input terminals of the meander lines 51, 52 and 53 and the earth, respectively.

Figure 8:
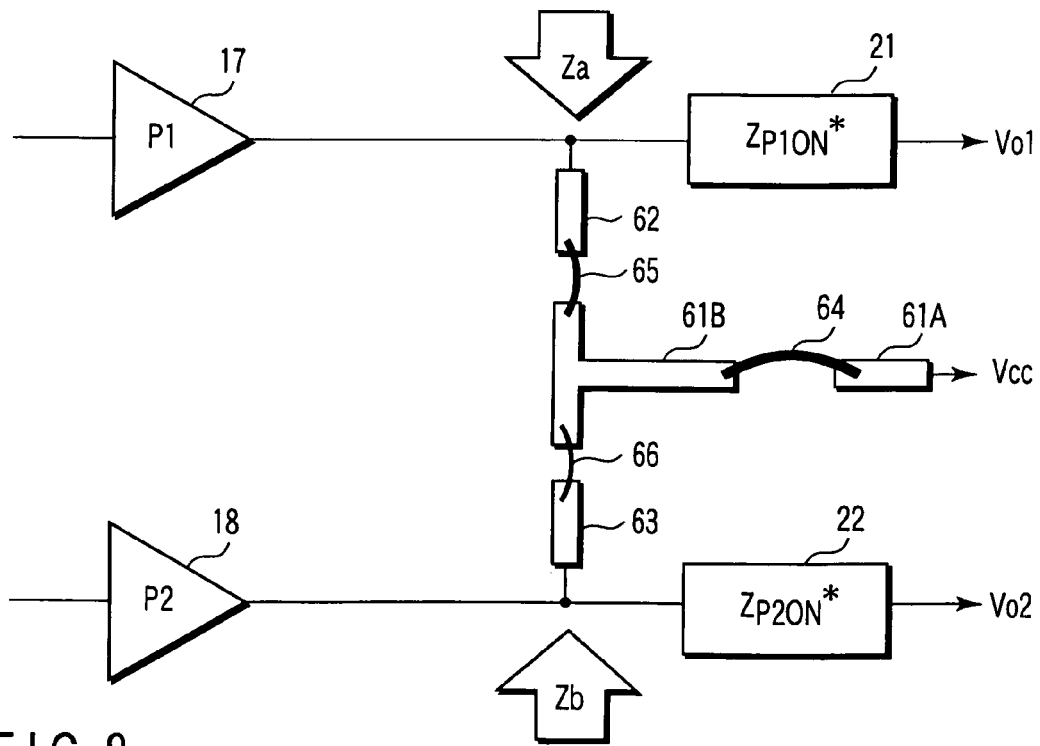
FIG. 8 shows a third structure example of the power supply circuit incorporated in the first embodiment.

FIG. 8 shows a third example of the power amplifier of the first embodiment. In this example, the power supply circuit is formed of transmission lines and bonding wires. A straight transmission line 61A, T-shaped transmission line 61B and boding wire 64 connecting them provide a common power supply path corresponding to the common power supply path 31 in FIG. 1A. The T-shaped transmission line 61B, transmission line 62 and boding wire 65 connecting them provide an individual power supply path corresponding to the individual power supply path 32 in FIG. 1A. Similarly, the T-shaped transmission line 61B, transmission line 63 and boding wire 66 connecting them provide an individual power supply path corresponding to the individual power supply path 33 in FIG. 1A. Desired impedances can be obtained by changing the lengths and/or thicknesses of the bonding wires 64, 65 and 66.

Figure 9:
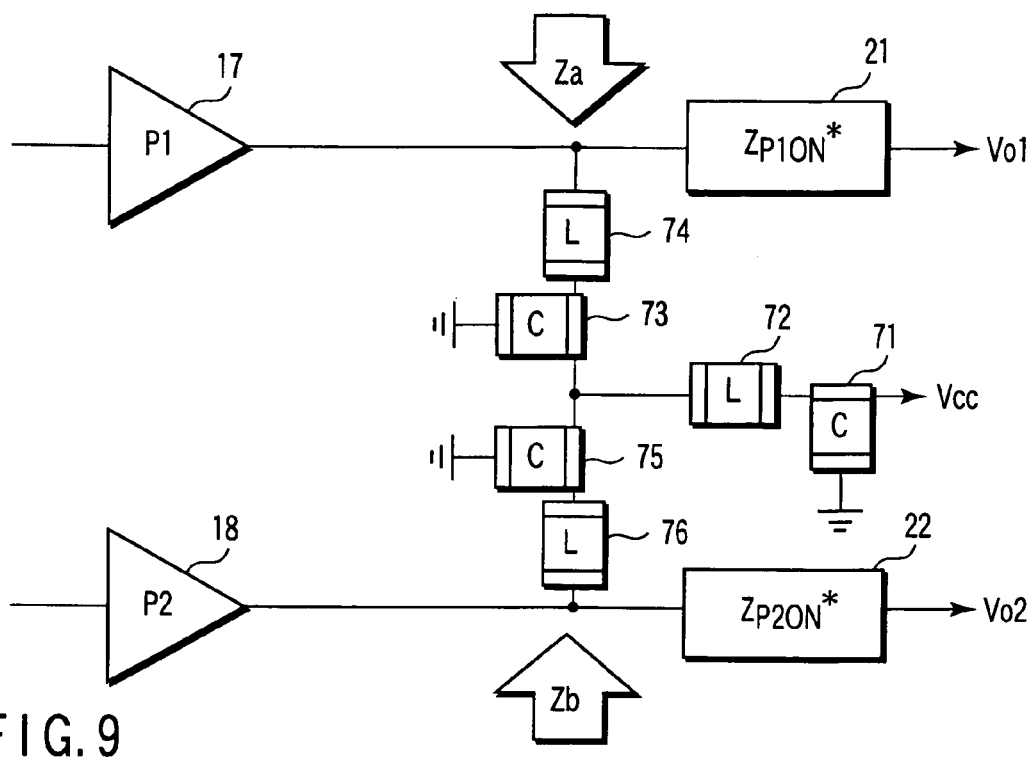
FIG. 9 shows a fourth structure example of the power supply circuit incorporated in the first embodiment.

FIG. 9 shows a fourth example of the power amplifier of the first embodiment. In this example, the power supply circuit is formed of chip components that include capacitors and inductors. A capacitor 71 and inductor 72 provide a common power supply path corresponding to the common power supply path 31 in FIG. 1A. A capacitor 73 and inductor 74 provide an individual power supply path corresponding to the individual power supply path 32 in FIG. 1A, while a capacitor 75 and inductor 76 provide an individual power supply path corresponding to the individual power supply path 33 in FIG. 1A.

Figure 10:
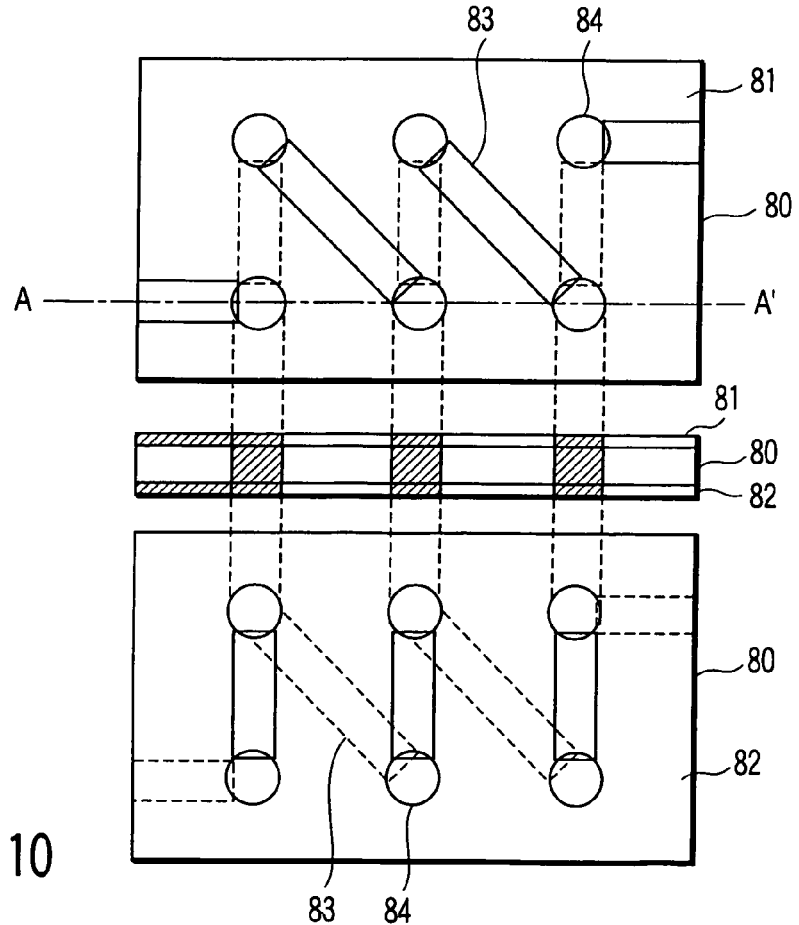
FIG. 10 shows a fifth structure example of the power supply circuit incorporated in the first embodiment.

FIG. 10 shows a fifth example of the power amplifier of the first embodiment. In this example, the power supply circuit is formed of inductors or median lines using via holes. Specifically, wiring layers 81 and 82 on the upper and lower surfaces of a plate 80 called a module plate, respectively. Each of the wiring layers 81 and 82 has a transmission line 83 of a predetermined pattern. The upper and lower surfaces of the substrate 80 are connected to each other by via holes 84, thereby forming inductors or median lines.

Also in the second to fifth examples, R1, R2, R3, X1, X2 and X3 can be determined by combining the equations (11), (12) and (13) with the formulas (1), (2), (3) and (4), and setting an appropriate frequency.

FIGS. 11A and 11B shows front and back structures of a sixth example of the power amplifier of the first embodiment, respectively. In this example, the amplifier elements and power supply circuit are provided on different layers of a multilayer substrate. Specifically, the f1 and f2 amplifier elements 17 and 18 and individual power supply paths 32 and 33 are provided on the upper surface of a multilayer substrate 90, while the common power supply path 31 is provided on the lower surface of the substrate 90.

THIRD EMBODIMENT

Figure 12A:
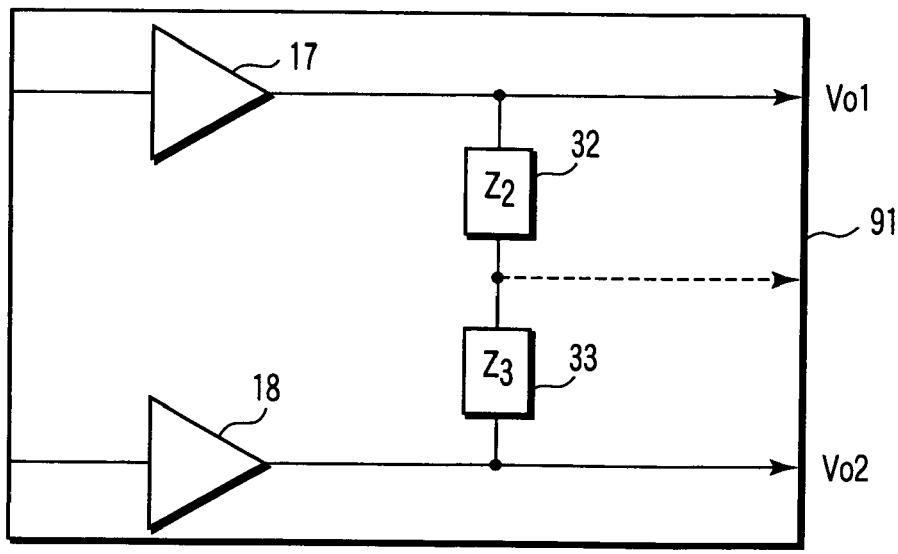
FIGS. 12A, 12B and 12C are schematic diagrams illustrating plural side specific structure examples of a power amplifier according to a third embodiment.
Figure 12B:
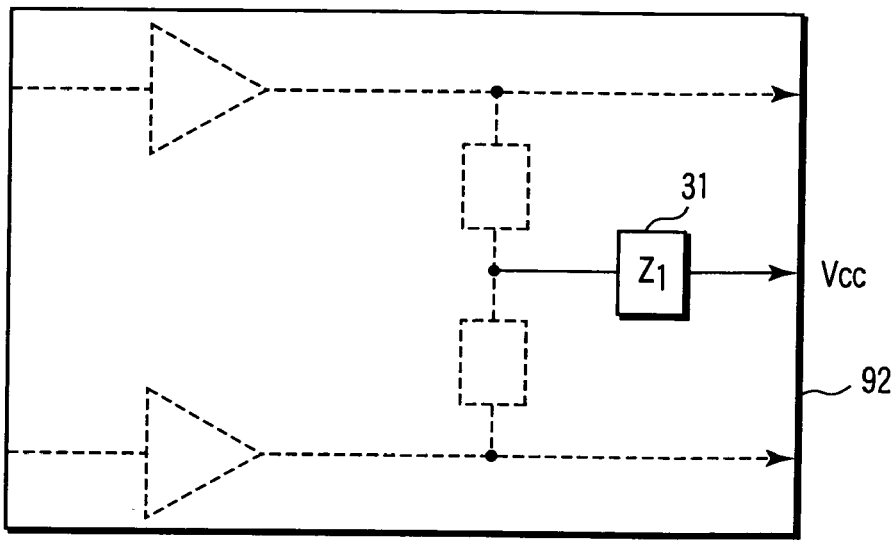
Figure 12C:
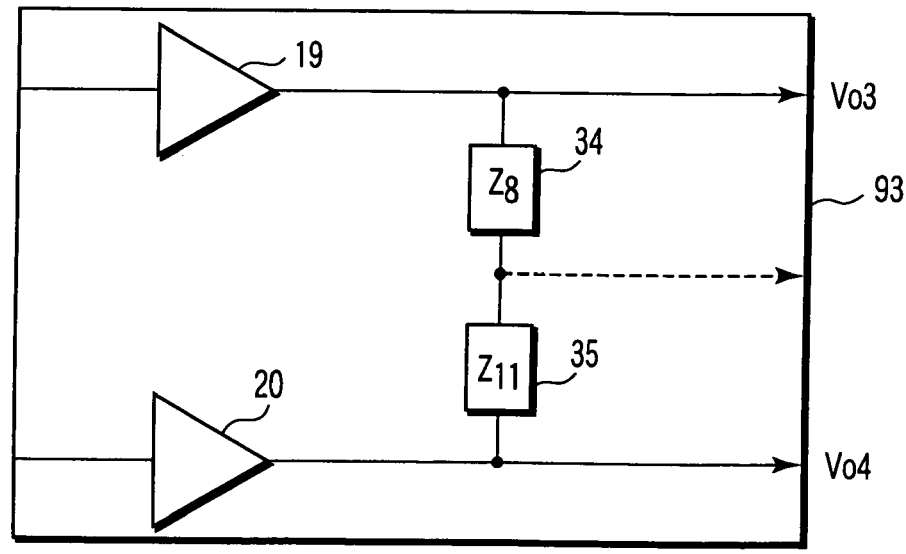

FIGS. 12A, 12B and 12C show, respectively, plural structures of a power amplifier according to a third embodiment that is operable at the four frequencies f1, f2, f3 and f4. This power amplifier employs the structure shown in FIG. 11A and 11B. Specifically, f1 and f2 amplifier elements 17 and 18 and individual power supply paths 22 and 23 are provided on the upper surface 91 of a multilayer substrate. A common power supply path 21 is provided on the intermediate layer 92 of the substrate. Further, f3 and f4 amplifier elements 19 and 20 and individual power supply paths 24 and 25 are provided on the lower surface 93 of the substrate.

FOURTH EMBODIMENT

FIG. 13 shows a power amplifier according to a fourth embodiment of the invention. The power amplifiers of the first and second embodiments have a single-stage structure, while the power amplifier of the fourth embodiment has a dual-stage structure.

In the fourth embodiment, input signals Vi1 and Vi2 of frequencies f1 and f2, supplied to input terminals 11 and 12, are input to the first-stage f1 and f2 amplifier elements 17A and 18A via input matching circuits 14 and 15, respectively. The outputs of the first-stage f1 and f2 amplifier elements 17A and 18A are input to the second-stage f1 and f2 amplifier elements 17B and 18B via intermediate matching circuits 24 and 25, respectively. The outputs of the second-stage f1 and f2 amplifier elements 17B and 18B are extracted as output signals Vo1 and Vo2 via output matching circuits 21 and 22, respectively.

DC power is supplied to the first-stage f1 and f2 amplifier elements 17A and 18A via a first power supply circuit that has a common power supply path 31A and individual power supply paths 32A and 33A. Similarly, DC power is supplied to the second-stage f1 and f2 amplifier elements 17B and 18B via a second power supply circuit that has a common power supply path 31B and individual power supply paths 32B and 33B. The fourth embodiment can be modified into a power amplifier including a three-stage or more structure.

FIFTH EMBODIMENT

Figure 14:
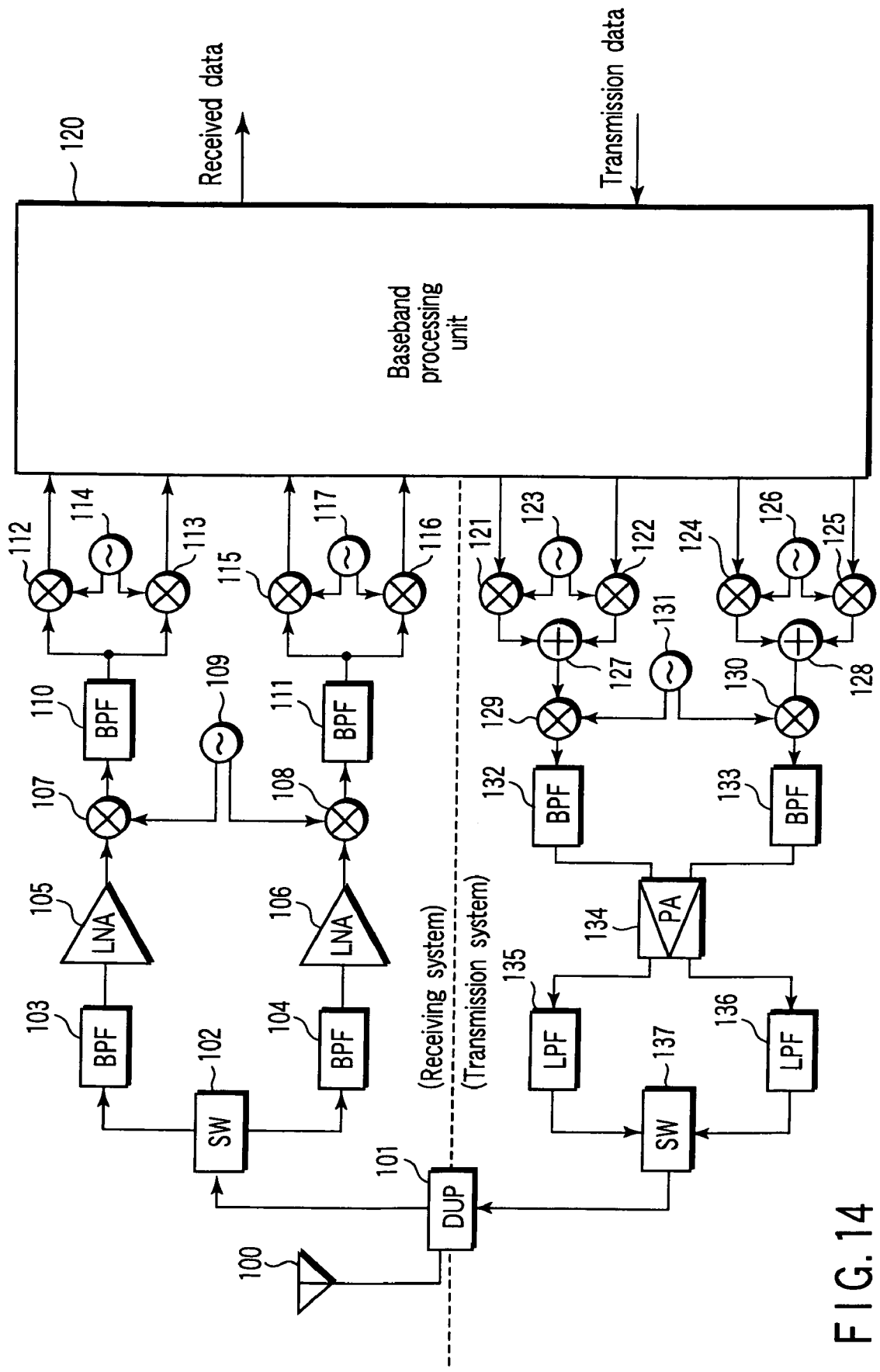
FIG. 14 is a block diagram of a radio communication device according to a fifth embodiment.

A description will be given of a radio communication device according to a fifth embodiment of the invention, in which the power amplifier of the first embodiment is incorporated in the transmission system of the device. FIG. 14 shows the configuration of a radio communication device operable at two frequency bands.

Firstly, the receiving system of the device will be described. An RF reception signal received by an antenna 100 is guided to the receiving system via a duplexer 101, and distributed into two receiving routes by a switch 102 in accordance with its frequency. If the RF signal is distributed into a first receiving route, it is guided to a mixer 107 via a band-pass filter (BPF) 103 and low noise amplifier (LNA) 105, and is subjected to frequency conversion based on a local signal from a local signal source 109, i.e., it is down-converted.

The output signal of the mixer 107 is simultaneously input to two mixers 112 and 113 via a band-pass filter 110. The mixers 112 and 113 provide an orthogonal demodulator, receive orthogonal local signals from a local signal source 114, and convert the signals, supplied from the band-pass filter 110, into orthogonal reception baseband signals, i.e., I and Q signals. The orthogonal reception baseband signals are input to a baseband processing unit 120, where they are reproduced as received data.

A second receiving route is similar to the first one, and comprises a band-pass filter 104, low noise amplifier 106, mixer 108, band-pass filter 108, mixers 115 and 116, and local signal source 117. The local signal source 117 generates local signals of a frequency different from that of the local signals generated by the local signal source 114.

The transmission system will now be described. The baseband processing unit 120 performs digital signal processing on transmission data, thereby generating orthogonal transmission baseband signals, i.e., I and Q signals. The generated I/Q signals are input to one of the transmission routes in accordance with their transmission frequency. If the I/Q signals are input to a first transmission route, they are multiplied, in mixers 121 and 122, by the respective orthogonal local signals from a local signal source 123. The output signals of the mixers 121 and 122 are added by an adder 127. The mixers 121 and 122 and adder 127 form an orthogonal modulator.

The output signal of the adder 127 is guided to a mixer 129, where it is subjected to frequency conversion based on a local signal from a local signal line 131, i.e., it is up-converted. The output signal of the mixer 129 is supplied to a band-pass filter 132, where an unnecessary component is eliminated therefrom. After that, the resultant signal is amplified by a power amplifier 134. The output signal of the power amplifier 134 is guided to a switch 137 via a low-pass filter 135, and then to the antenna 100 via the duplexer 101. Thus, the signal is output as an electric wave from the antenna.

The other transmission route, i.e., a second route, is similar to the first one, and comprises mixers 124 and 125 and adder 128 providing an orthogonal modulator, local signal source 126 for the orthogonal modulator, mixers 129 and 130 and local signal line 131 for up-conversion, band-pass filter 133, power amplifier 134 and low-pass filter 136. The transmission frequency, i.e., the frequency of a transmission signal input to the power amplifier 134, differs from that of the first transmission route.

If the power amplifier of the first embodiment is used as the power amplifier 134, it can be commonly used for two transmission routes. This being so, the whole area required for the power amplifier can be reduced compared to the case where respective power amplifiers are used for two transmission routes, which contributes to the reduction of the size and cost of the radio communication device. Further, a radio communication device having three or more frequencies can be realized by modifying the configuration of FIG. 14.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power amplifier comprising:
    a first amplifier element configured to amplify a first input signal of a first frequency, the first amplifier element including a first input terminal which receives the first input signal, and a first output terminal which outputs a first output signal obtained by amplifying the first input signal;
    a second amplifier element configured to amplify a second input signal of a second frequency, the second amplifier element including a second input terminal which receives the second input signal, and a second output terminal which outputs a signal obtained by amplifying the second input signal;
    a power supply input terminal connected to a direct-current power supply;
    a common power supply path including an end connected to the power supply input terminal, and another end;
    a first individual power supply path including an end connected to the another end of the common power supply path, and another end connected to the first output terminal, the first individual power supply path having a first impedance;
    a second individual power supply path including an end connected to the another end of the common power supply path, and another end connected to the second output terminal, the second individual power supply path having a second impedance; and
    a multilayer substrate comprising a first layer and a second layer,
    wherein the first amplifier element and the second amplifier element are provided on the first layer, and the common power supply path, the first individual power supply path and the second individual power supply paths are provided on the first layer and the second layer wherein the power supply paths are selectively divided to the first layer and the second layer.

2. A power amplifier comprising:
    a first amplifier element configured to amplify a first input signal of a first frequency, the first amplifier element including a first input terminal which receives the first input signal, and a first output terminal which outputs a first output signal obtained by amplifying the first input signal;
    a second amplifier element configured to amplify a second input signal of a second frequency, the second amplifier element including a second input terminal which receives the second input signal, and a second output terminal which outputs a signal obtained by amplifying the second input signal;
    a power supply input terminal connected to a direct-current power supply;
    a common power supply path including an end connected to the power supply input terminal, and another end;
    a first individual power supply path including an end connected to the another end of the common power supply path, and another end connected to the first output terminal, the first individual power supply path having a first impedance;
    a second individual power supply path including an end connected to the another end of the common power supply path, and another end connected to the second output terminal, the second individual power supply path having a second impedance;
    a first output matching circuit connected to the first output terminal of the first amplifier element;
    a second output matching circuit connected to the second output terminal of the second amplifier element; and
    a multilayer substrate including first layer and second layer,
    wherein the first amplifier element and the second amplifier element are provided on the first layer, and the common power supply path and the first individual power supply path and the second individual power supply path are provided on the first layer and the second layer wherein the power supply paths are selectively divided to the first layer and the second layer.

3. A radio communication device which performs data reception and transmission using one frequency band selected from a plurality of frequency bands, comprising:
    a transmission signal generator which generates a transmission signal of the one frequency band; and
    the power amplifier according to claim 1, the power amplifier receiving the transmission signal as an input signal.

4. A radio communication device which performs data reception and transmission using one frequency band selected from a plurality of frequency bands, comprising:
    a transmission signal generator which generates a transmission signal of the one frequency band; and
    the power amplifier according to claim 2, the power amplifier receiving the transmission signal as an input signal.

* * * * *